(12) United States Patent
Shimomura

(10) Patent No.: US 8,817,929 B2
(45) Date of Patent: Aug. 26, 2014

(54) TRANSMISSION CIRCUIT AND COMMUNICATION SYSTEM

(75) Inventor: Yukio Shimomura, Kanagawa (JP)

(73) Assignee: Sony Corporation, Tokyo (JP)

( * ) Notice: Subject to any disclaimer, the term of this patent is extended or adjusted under 35 U.S.C. 154(b) by 368 days.

(21) Appl. No.: 13/137,261

(22) Filed: Aug. 2, 2011

(65) Prior Publication Data

US 2012/0033748 A1 Feb. 9, 2012

(30) Foreign Application Priority Data

Aug. 9, 2010 (JP) ................................ P2010-178721

(51) Int. Cl.
*H04L 7/00* (2006.01)
(52) U.S. Cl.
USPC ........... 375/354; 375/259; 375/295; 341/100; 341/101
(58) Field of Classification Search
USPC ........................................................ 375/295
See application file for complete search history.

(56) References Cited

U.S. PATENT DOCUMENTS

| 4,829,475 | A | * | 5/1989 | Ward et al. ...................... 365/78 |
| 6,215,517 | B1 | * | 4/2001 | Takahashi et al. .............. 348/72 |
| 6,336,190 | B1 | * | 1/2002 | Yamagishi et al. ........... 713/400 |
| 6,476,738 | B1 | * | 11/2002 | Mitsutani ...................... 341/100 |
| 2007/0002965 | A1 | * | 1/2007 | Bauch et al. .................. 375/295 |

* cited by examiner

*Primary Examiner* — Lihong Yu
(74) *Attorney, Agent, or Firm* — Sony Corporation

(57) ABSTRACT

A transmission circuit includes: a plurality of lane blocks arranged in parallel to each other configured to convert parallel data supplied from a corresponding lane into serial data and output the serial data; and a clock enabler block including at least one clock enabler for outputting a drive clock phase-locked with a reference clock to the plurality of lane blocks after a plurality of cycles of the drive clock in response to an enable signal. Each of the plurality of lane blocks has a divider for dividing the drive clock supplied from the clock enabler block to generate a divide clock and a load signal, and a parallel-to-serial converter for converting parallel data supplied from the corresponding lane into serial data in synchronization with the divide clock and the load signal generated by the divider and the drive clock generated by the clock enabler block.

17 Claims, 18 Drawing Sheets

F I G . 9
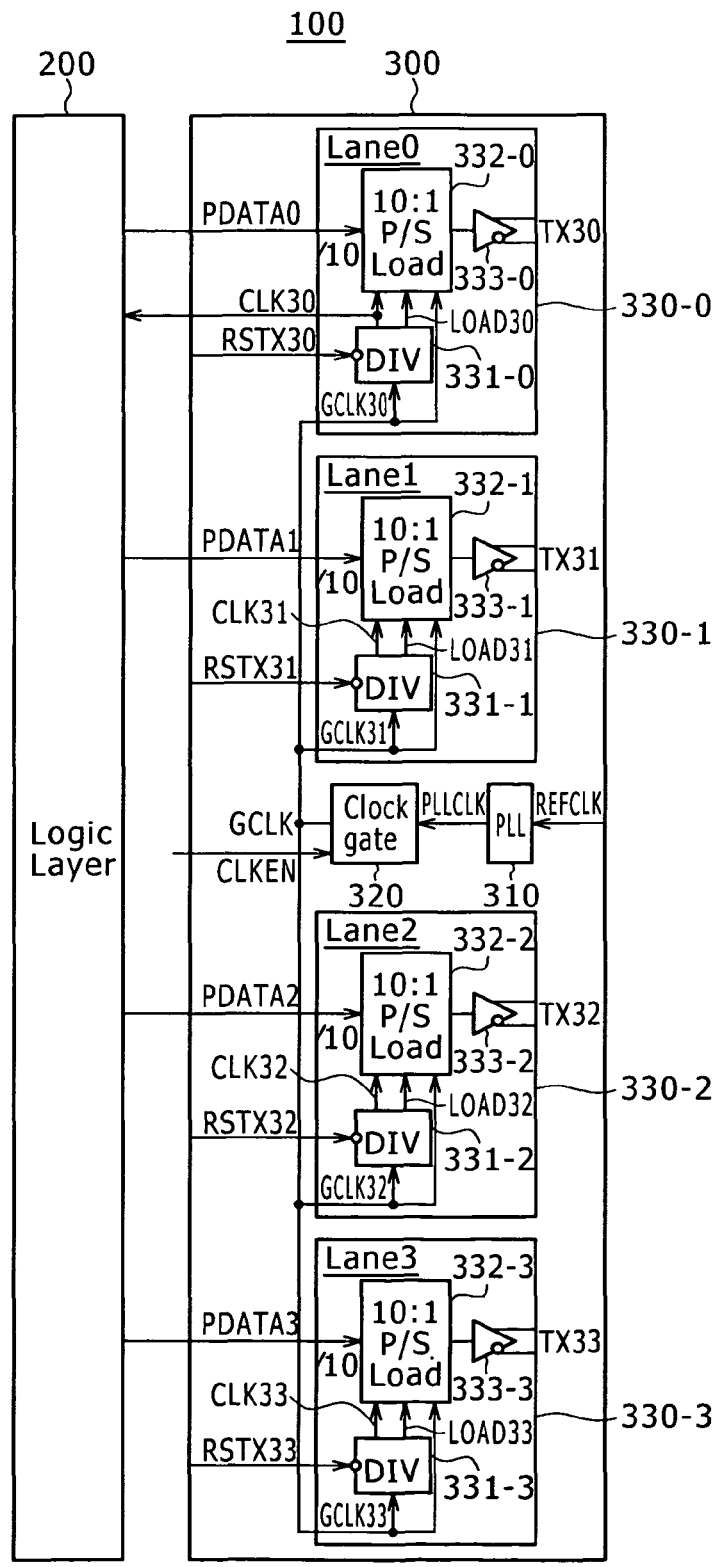

⬚ :LOGIC VALUE UNCERTAIN

FIG. 17

| SYNC CONTROL | | En8 | En4A | En4B | En2A | En2B | En2C | En2D |
|---|---|---|---|---|---|---|---|---|
| 1 | x8ch | Control | High | High | High | High | High | High |
| 2 | x4ch(4A) | High | Control | High | High | High | High | High |
| 3 | x4ch(4B) | High | High | Control | High | High | High | High |
| 4 | x2ch(2A) | High | High | High | Control | High | High | High |
| 5 | x2ch(2B) | High | High | High | High | Control | High | High |
| 6 | x2ch(2C) | High | High | High | High | High | Control | High |
| 7 | x2ch(2D) | High | High | High | High | High | High | Control |

TRANSMISSION CIRCUIT AND COMMUNICATION SYSTEM

BACKGROUND

The present disclosure relates to a transmission circuit in a data interface having two or more lanes and a communication system.

A transmission circuit having two or more lanes (or channels) is mainly based on a common divider scheme or an individual divider scheme.

Referring to FIG. 1, there is shown an exemplary configuration of a communication apparatus having a transmission circuit based on a common divider scheme.

A communication 1 in FIG. 1 has a logic layer block 2 and a transmission circuit 3.

The logic layer block 2 supplies 10-bit data Pdata [9:0] of two or more (four in this example) lanes (or channels) to the transmission circuit 3.

The transmission circuit 3 has four lane blocks 31-0 through 31-3, a PLL circuit 32, and a divider (DIV) 33 connected commonly to the four lane blocks 31-0 through 31-3.

The four lane blocks 31-0 through 31-3, a PLL circuit 32 each have a same configuration.

The PLL circuit 32 generates a drive clock PLLCLK synchronized with a reference clock REFCLK and supplies the drive clock PLLCLK to the divider 33 and the lane blocks 31-0 through 31-3.

The divider 33 divides the drive clock PLLCLK to generate a load signal LOAD and a division clock CLK10, and supplies the load signal LOAD and the divide clock CLK10 to the lane blocks 31-0 through 31-3.

It should be noted that the divider 33 is reset by a reset signal RSTX.

The divide clock CLK10 of the divider 33 is used also as a system clock of the logic layer block 2.

The lane blocks 31-0 through 31-3 have 10:1 parallel-to-serial converters) P/S0 through P/S3 and differential output blocks DF0 through DF3, respectively.

Referring to FIG. 2, there is shown an exemplary configuration of the parallel-to-serial converter.

Referring to FIG. 3, there is shown a timing chart of the parallel-to-serial converter shown in FIG. 2.

The parallel-to-serial converter P/S (0 through 3) shown in FIG. 2 is formed by flip-flops FF0 through FF9 and FF10 and selector SL0 through SL9.

The parallel-to-serial converter P/S has the FF10 at the data input stage. The flip-flop FF10 receives parallel data Pdata at data input D from the logical layer block 2, latches the received data Pdata in synchronization with divide clock CLK10 from the divider 33, and outputs the latched data.

The data output Q of the flip-flop FF-10 is connected to the first input terminal of the selectors SL9 through SL0. The selectors SL9 through SL0 select the first input terminal, namely, the output data of the flip-flop FF10 when a load signal LOAD from the divider 33 is at the high level and select the input data of the second input terminal when the load signal LOAD is at the low level.

The flop-flops FF9 through FF0 are connected in a cascaded manner, a drive clock PLLCLK being supplied to the clock input from the PLL circuit 32.

The data input D of the flip-flop FF9 is connected to the output terminal of the selector SL9, and the second input terminal of the selector SL9 is fixed to the low level.

The data input D of the flip-flop FF8 is connected to the output terminal of the selector SL8, and the second input terminal of the selector SL8 is connected to the data output Q of the flip-flip FF9.

The data input D of the flip-flop FF7 is connected to the output terminal of the selector SL7, and the second input terminal of the selector SL7 is connected to the data output Q of the flip-flip FF8.

The data input D of the flip-flop FF6 is connected to the output terminal of the selector SL6, and the second input terminal of the selector SL6 is connected to the data output Q of the flip-flip FF7.

The data input D of the flip-flop FF5 is connected to the output terminal of the selector SL5, and the second input terminal of the selector SL5 is connected to the data output Q of the flip-flip FF6.

The data input D of the flip-flop FF4 is connected to the output terminal of the selector SL4, and the second input terminal of the selector SL4 is connected to the data output Q of the flip-flip FF5.

The data input D of the flip-flop FF3 is connected to the output terminal of the selector SL3, and the second input terminal of the selector SL3 is connected to the data output Q of the flip-flip FF4.

The data input D of the flip-flop FF2 is connected to the output terminal of the selector SL2, and the second input terminal of the selector SL2 is connected to the data output Q of the flip-flip FF3.

The data input D of the flip-flop FF1 is connected to the output terminal of the selector SL1, and the second input terminal of the selector SL1 is connected to the data output Q of the flip-flip FF2.

The data input D of the flip-flop FF0 is connected to the output terminal of the selector SL0, and the second input terminal of the selector SL0 is connected to the data output Q of the flip-flip FF1.

The data output Q of the flip-flop FF0 is connected to the input terminal of the differential output block DF.

In the parallel-to-serial converter P/S, the data Pdata of the corresponding lane is latched in synchronization with the divide clock CLK10 from the divider 33, a resultant latched data PDATALT being outputted to the first input terminals of the selectors SL9 through SL0.

Next, while the load signal LOAD is at the high level, the data PDATALT is latched by the flip-flops FF0 through FF0 in synchronization with the drive clock PLLCLK.

The latched data of the flip-flops FF9 through FF0 is shifted in synchronization with the drive clock PLLCLK after the changing of the load signal LOAD from the high level to the low level, the shifted data being outputted from the differential output block DF as differential serial data TX.

Referring to FIG. 4, there is shown an exemplary configuration of the communication apparatus having a transmission circuit based on an individual divider scheme.

In a communication apparatus 1A shown in FIG. 4, dividers 33-0 through 33-3 are arranged for lane blocks 31A-1 through 31A-3, respectively, of an transmission circuit 3A.

In addition, FIFO 4-1 through FIFO 4-3 are inserted between the data output of a logic layer block 2 and the input blocks of the lane blocks 31A-1 through 31A-3 of the transmission circuit 3A.

SUMMARY

However, the related-art communication apparatus based on the common divider scheme described above has the following disadvantages.

Namely, the common divider scheme, simple in configuration owning to the common divider, is required to long-distance distribute two or more divider output signals (PLLCLK, LOAD, and CLK10) to the parallel-to-serial converters P/S of the two or more lane blocks 31-0 through 31-4 while satisfying timing restrictions between the divider output signals.

For this reason, no problem is observed at low data rates, but the design verification is difficult at high clock frequencies brought about by the recent data rates of Gbps.

The 10:1 parallel-to-serial converter P/S shown in FIG. 2 is an orthodox example, in which there are timing restrictions between the clock signals PLLCLK, LOAD, and CLK10 as shown in FIG. 3.

On the other hand, the common divider scheme requires difficult clock wiring redesign every time there occurs a change in lanes (namely, the number of lanes for example).

In addition, in the individual divider scheme described above, the arrangement of dividers for individual lanes makes it a little easier to execute design verification than that of the common divider scheme because only one signal, namely, a divider drive clock PLLCLK, is distributed to two or more lanes.

On the other hand, with the individual divider scheme, the dividers 33-0 through 33-3 individually execute divider operations although the drive clock PLLCLK is common.

Hence, the individual divider scheme may cause a so-called inter-lane skew in which data start positions get misaligned between the lanes as shown in FIG. 5 unless the reset clear timings are aligned.

In the source synchronous transmission mode, one of the lanes is often used as a clock lane for use as a data capture signal and a data symbol delimit decision signal.

Consequently, it is necessary for the rising edge of the clock to be the same as the head of data symbol (D0) in timing; however, if there is an inter-lane skew in the data lane clock, the head of symbol may be misread as shown in FIG. 6.

It should be noted that FIG. 6 shows an example of octal data rate source synchronous.

Obviously, if a small inter-lane skew is found on the transmission side, there is techniques (deskew, phase align, and so on) for removing the skew by inserting a particular control code (a sync pattern) into the transmission data.

However, because the smaller transmission side skew can simplify the reception side deskew function, advantages are obtained in the number of design processes, the circuit scale, and the power dissipation, for example. Especially, in the source synchronous mode, the deterioration of the transmission efficiency due to the redundancy in the control code to be inserted can be avoided.

On the other hand, seen from the side of the upper logic layer, the divide clock CLK of the divider of each lane is also used as a logic layer system clock.

It should be noted that, because there is normally only one this clock, one of the divide clocks CLK100, CLK101, CLK102, and CLK103 for the number of lanes (four in FIG. 4) is used as a system clock. In this example, the divide clock CLK100 of the divider 33-0 of the lane block 31A-0 provides the source of the system clock CLKM.

Now, when the data transmission from the logic layer is considered, a reception register PDATA0 in the lane block 31A-0 is the data generated from the source of the divide clock CLK100 of the lane block 31A-0, so that this data can be synchronized with ease.

On the other hand, in the lane block 31A-1, it is required to synchronize data PDATA1 generated from the source of the divide clock CLK100 of the lane block 31A-0 with the divide clock CLK101 of the lane block 31A-1. Therefore, if there is an uncertain skew between the divide clock CLK100 and the divide clock CLK101, the synchronization is generally difficult.

In FIG. 7, while data PDATA00 is latched by the reception register PDATAL0 in the lane block 31A-0, there is a skew between a transmission clock CLKM and the divide clock CLK101 to be received in the lane block 31A-1.

Hence, a register hold violation occurs, making it necessary to latch the data PDATA10 under ordinary circumstances; however, the data PDATA11 of the next cycle is latched by the reception register PDATAL1.

In the worse case, the data itself may be destroyed by meta-stables.

So, in order to provide a safe transfer between the skewed clocks, FIFO4-1 through FIFO4-3 are required in the lane blocks other than the lane block 31A-0 as shown in FIG. 4.

However, the FIFOs increase the circuit scale and may cause a data deviation on a symbol (8 to 10 CLKs) basis between lanes, thereby further increasing a data skew in the transmission path output after the conversion from parallel data to serial data.

Therefore, desirably, the clock skew is as small as possible not only from the reception side but also from the logic layer side.

However, as shown in FIG. 8, in order to make the skew small, the recovery/removal timing restrictions of reset signals RST0 and RST1 of each lane block relative to the drive clock PLLCLK must be satisfied.

The design verification for this satisfaction also becomes difficult as the data rate increases.

Therefore, the present disclosure desirably provides a transmission circuit and a communication apparatus configured to mitigate the timing restrictions of control signals to be distributed for the synchronization between two or more transmission lanes and reduce the number of design processes.

In carrying out the disclosure and according to a first embodiment thereof, there is provided a transmission circuit. This transmission circuit has a plurality of lane blocks arranged in parallel to each other configured to convert parallel data supplied from a corresponding lane into serial data and output the serial data; and a clock enabler block including at least one clock enabler for outputting a drive clock phase-locked with a reference clock to the plurality of lane blocks after a plurality of cycles of the drive clock in response to an enable signal. Each of the plurality of lane blocks has a divider for dividing the drive clock supplied from the clock enabler block to generate a divide clock and a load signal and a parallel-to-serial converter for converting parallel data supplied from the corresponding lane into serial data in synchronization with the divide clock and the load signal generated by the divider and the drive clock generated by the clock enabler block.

In carrying out the disclosure and according to a second embodiment thereof, there is provided a communication system. This communication system has a transmission circuit configured to convert parallel data into serial data to transmit the serial data; and a reception circuit configured to receive the serial data transmitted from the transmission circuit. In this configuration, the transmission circuit has a plurality of lane blocks arranged in parallel to each other configured to convert parallel data supplied from a corresponding lane into serial data and output the serial data; and a clock enabler block including at least one clock enabler for outputting a drive clock phase-locked with a reference clock to the plurality of lane blocks after a plurality of cycles of the drive clock in response to an enable signal. Each of the plurality of lane blocks has a divider for dividing the drive clock supplied from the clock enabler block to generate a divide clock and a load signal and a parallel-to-serial converter for converting parallel data supplied from the corresponding lane into serial data in synchronization with the divide clock and the load signal generated by the divider and the drive clock generated by the clock enabler block.

As described above and according to the present disclosure, the timing restrictions of control signals to be distributed for the synchronization between two or more transmission lanes can be mitigated, thereby reducing the number of design processes.

BRIEF DESCRIPTION OF THE DRAWINGS

FIG. 9 is a circuit diagram illustrating an exemplary configuration of a communication apparatus having a transmission circuit practiced as one embodiment of the present disclosure;

FIG. 17 is a matrix diagram illustrating a control matrix indicative of one example of a method of controlling enable signals to the clock enablers in accordance with the number of lane blocks to be synchronized in the transmission circuit shown in FIG. 16;

DETAILED DESCRIPTION OF THE PREFERRED EMBODIMENTS

Figure 1:
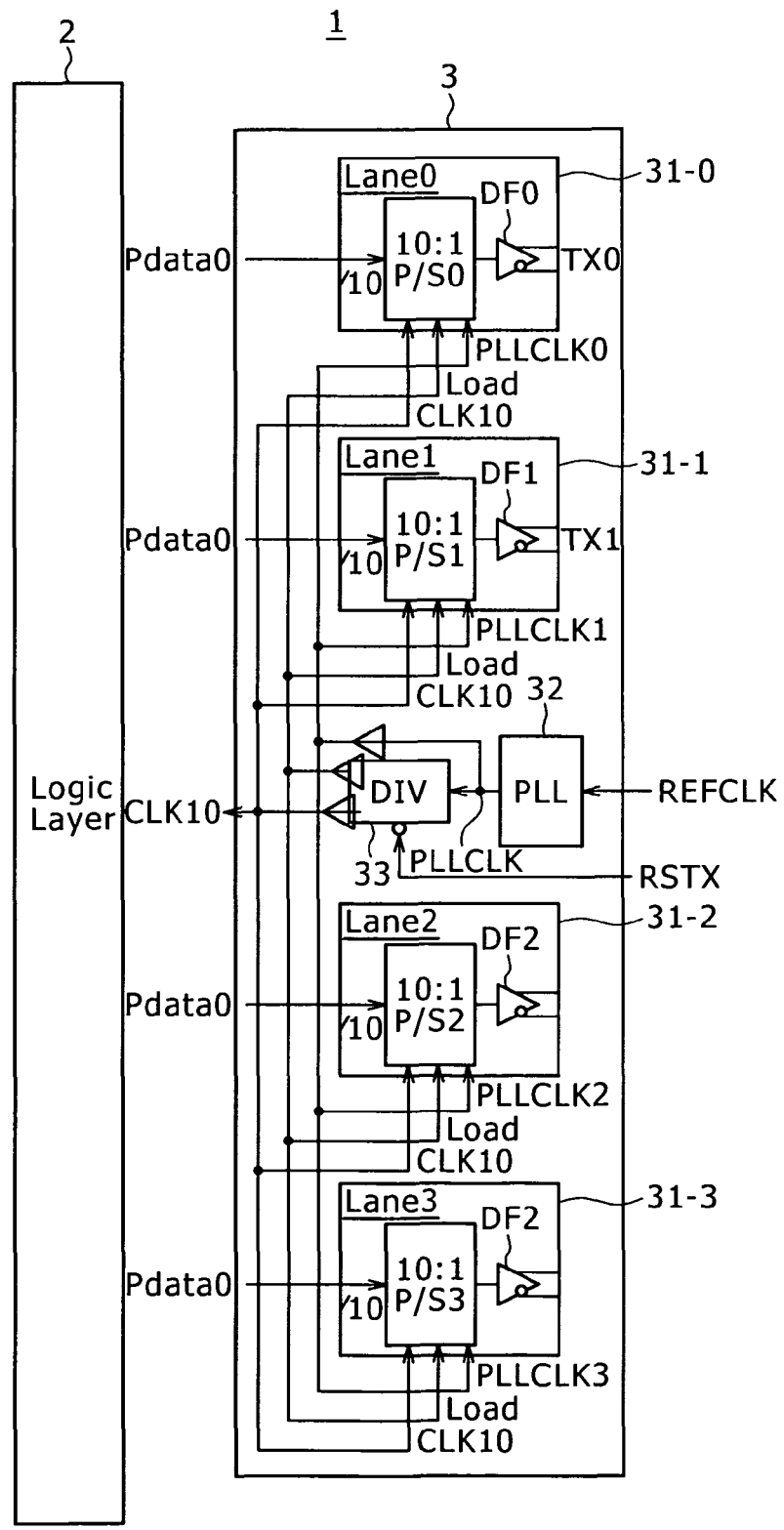
FIG. 1 is a circuit diagram illustrating an exemplary configuration of a communication apparatus having a transmission circuit based on a common divider scheme.
Figure 2:
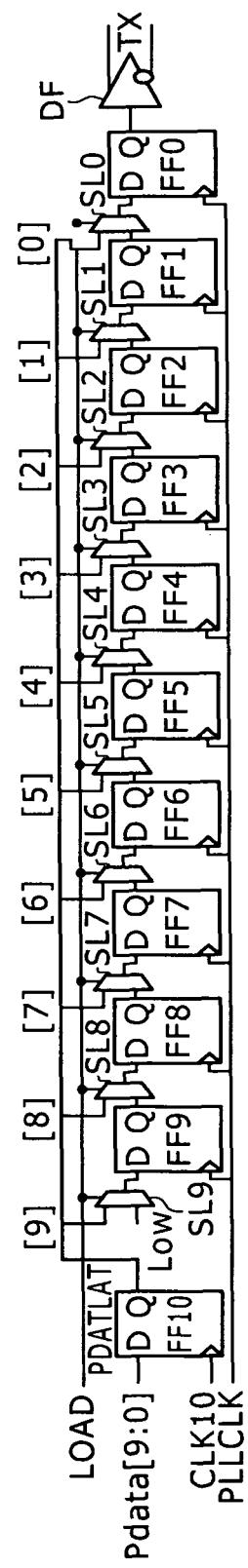
FIG. 2 is a circuit diagram illustrating an exemplary configuration of a parallel-to-serial converter.
Figure 3:
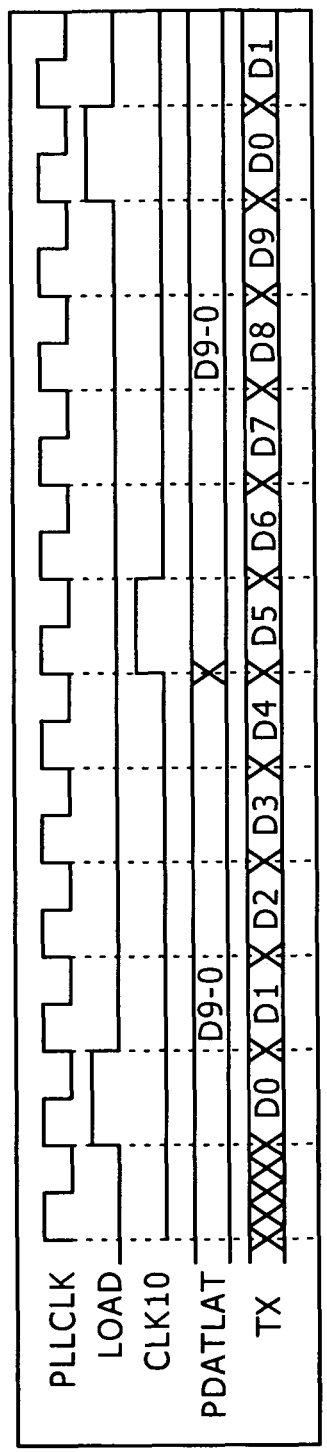
FIG. 3 is a timing chart indicative of an operation of the parallel-to-serial converter shown in FIG. 2.
Figure 4:
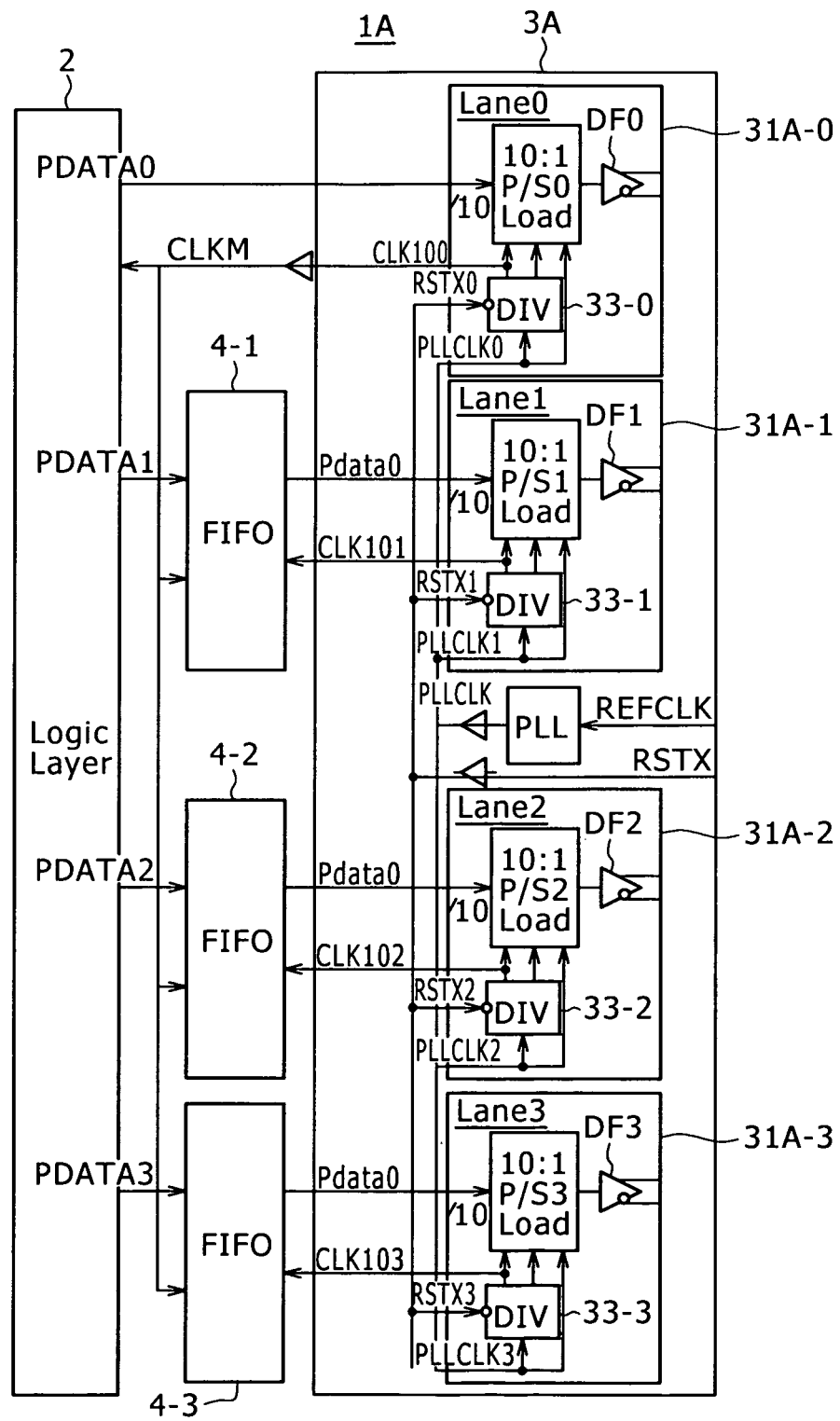
FIG. 4 is a circuit diagram illustrating an exemplary configuration of a communication apparatus having a transmission circuit based on a individual divider scheme.
Figure 5:
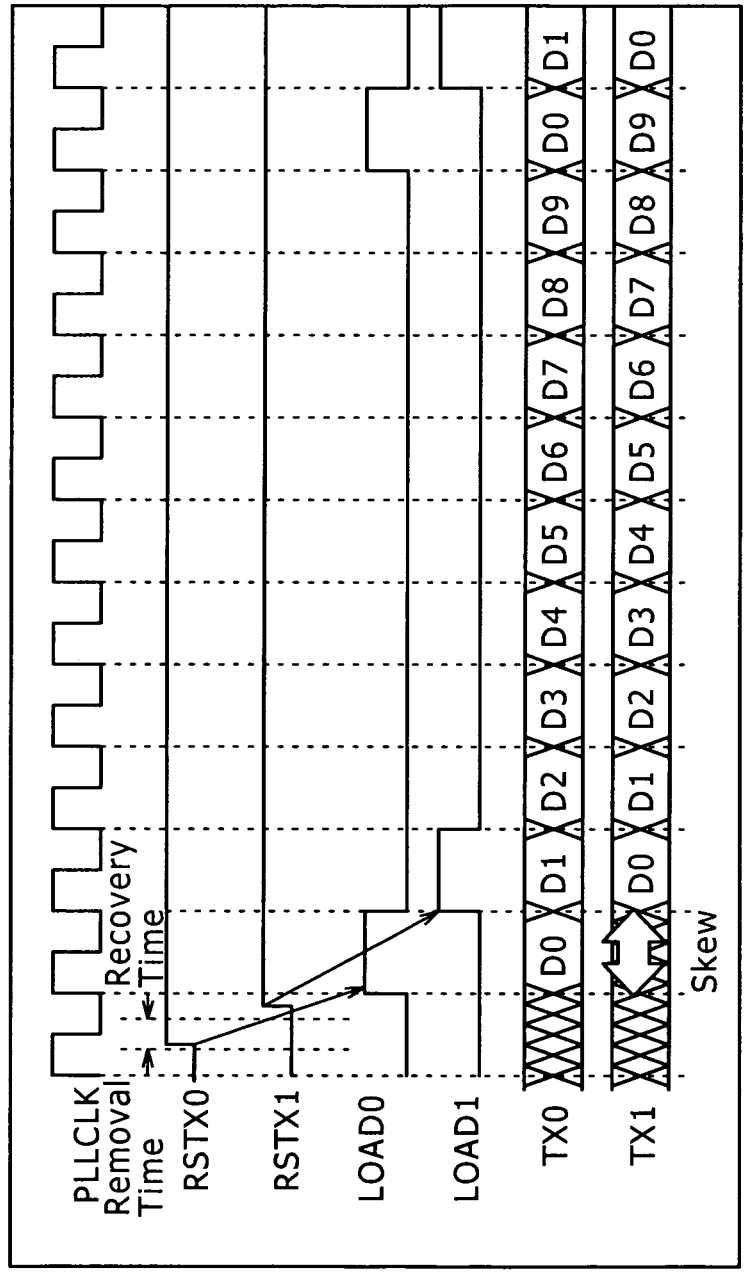
FIG. 5 is a timing chart indicative of a possible chance of generating an inter-lane skew when the individual divider scheme is employed.
Figure 6:
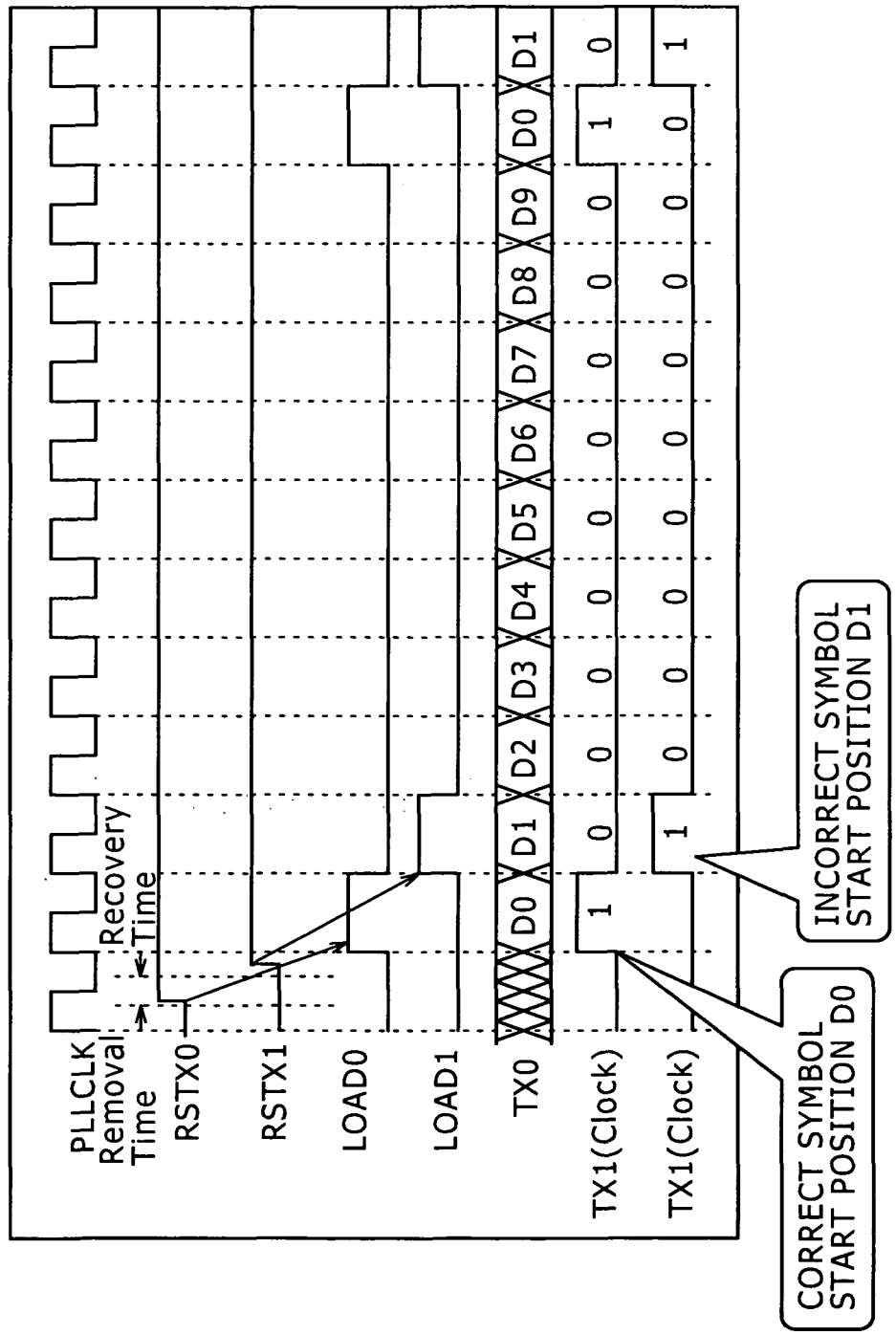
FIG. 6 is a timing chart indicative of a possible chance of misreading the head of symbol in an example of octal data rate source synchronous.
Figure 7:
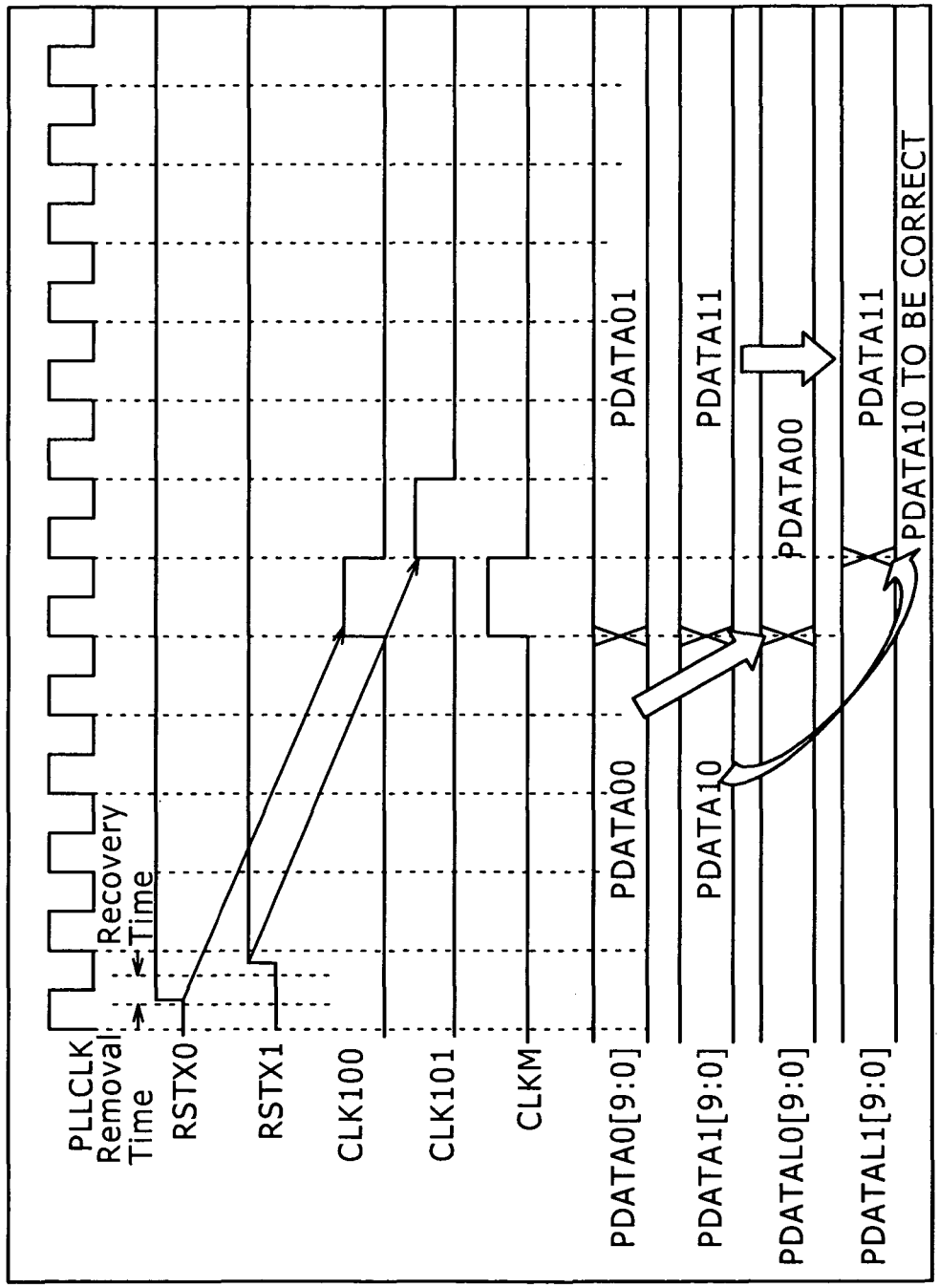
FIG. 7 is a timing chart indicative that there is a skew between a transmission clock and a divide clock to be received, thereby latching different data by register hold violation.
Figure 8:
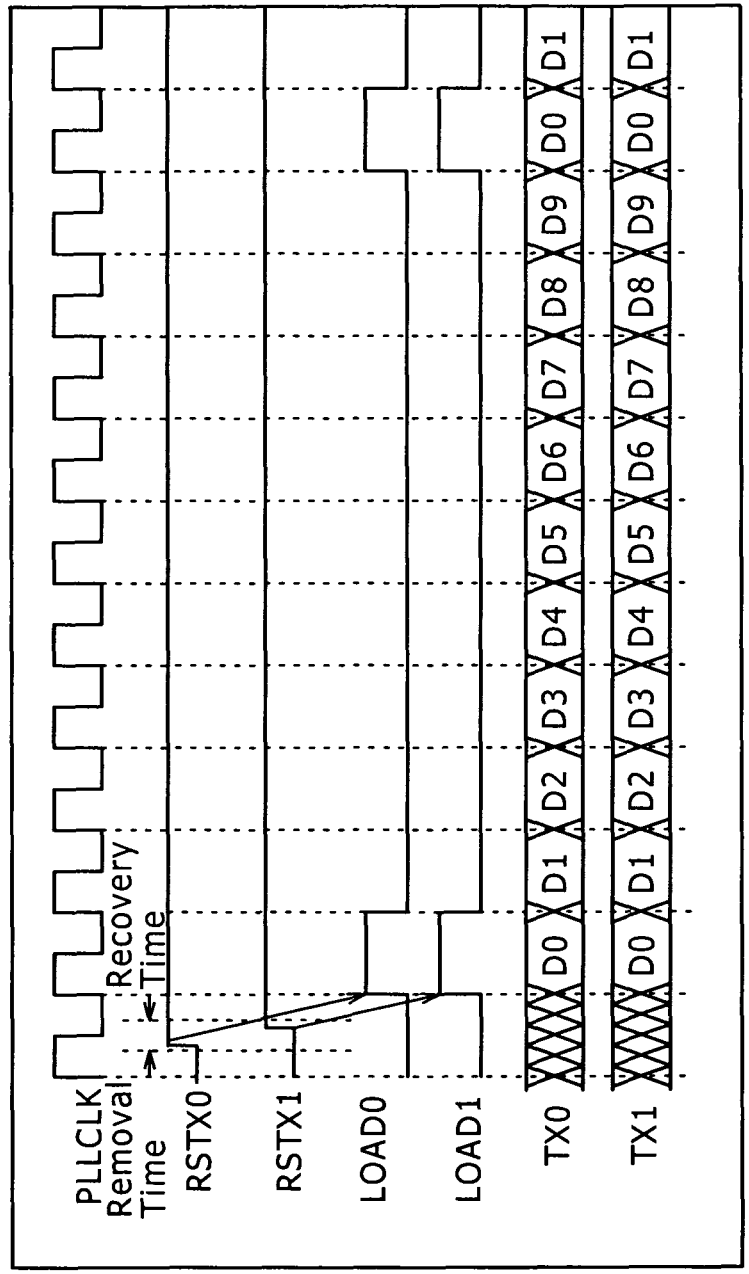
FIG. 8 is a timing chart indicative that, in order to make a skew small, it is necessary to satisfy recovery/removal timing restrictions for the reset signal of each lane block relative to a drive clock.

The present disclosure will be described in further detail by way of embodiments thereof with reference to the accompanying drawings. The description will be made in the following order.

1. An overall exemplary configuration of a communication apparatus
2. An exemplary configuration of a clock enabler
3. An example in which clock enablers are arranged in a tree structure
4. A communication system including a transmission circuit and a reception circuit <1. An Overall Exemplary Configuration of a Communication Apparatus>

Now, referring to FIG. 9, there is shown an exemplary configuration of a communication apparatus having a transmission circuit practiced as one embodiment of the present disclosure.

A communication apparatus 100 has a logic layer block 200 and a transmission circuit 300 as shown in FIG. 9.

The logic layer block 200 supplies 10-bit data Pdata [9:0] of n (n=4 in this example) lanes to the transmission circuit 300.

The transmission circuit 300 has a PLL circuit 310, a clock enabler block 320, and four lane blocks 330-0 through 330-3 each individually have a divider.

The PLL circuit 310 generates a drive clock PLLCLK that is phase-locked with a reference clock REFCLK and supplies the generated drive clock signal to the clock enabler 320.

The clock enabler 320 has function of turning on/off the output of the drive clock PLLCLK by the PLL circuit 310 without causing a hazard in accordance with an enable signal CLKEN including at least one clock enable.

When the enable signal CLKEN goes a high level, the clock enabler 320 outputs a clock GCLK after several cycles.

The clock enabler 320 distributes the clock GCLK as a drive clock for driving the lane blocks 330-0 through 330-3.

<2. An Exemplary Configuration of a Clock Enabler>

Figure 10:
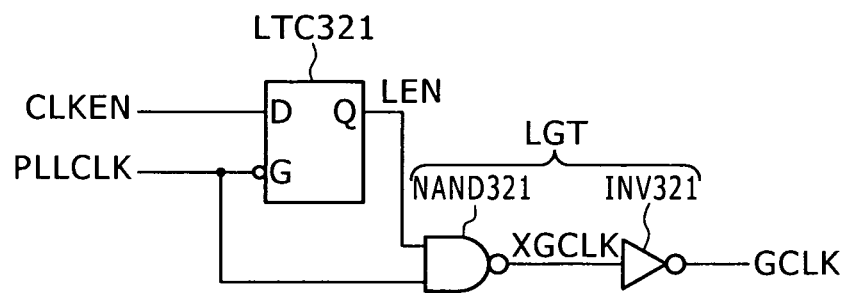
FIG. 10 is a circuit diagram illustrating an exemplary configuration of a clock enabler practiced as the embodiment of the present disclosure.

Referring to FIG. 10, there is shown an exemplary configuration of a clock enabler associated with the present embodiment.

This clock enabler 320a is made up of a slew latch circuit LTC 321, a 2-input NAND gate NAND321, and an inverter INV321 as shown in FIG. 10.

The input terminal D of the slew latch circuit LTC321 is connected to the input line of an enable signal CLKEN and the inverted clock input terminal G is connected to the input line of a drive clock PLLCLK.

One input terminal of the NAND gate NAND321 is connected to the output terminal Q of the slew latch circuit LTC321, other input terminal is connected to the input terminal of the drive clock PLLCLK, and the output terminal is connected to the input terminal of the inverter INV321.

In this clock enabler 320a, the enable signal CLKEN is sampled at the rising edge of the drive clock PLLCLK in the slew latch circuit LTC321.

Then, by the obtained sampling value, the clock pulse immediately after the sampling is passed or prevented by a logic gate LGT made up of the NAND gate NAND321 and the inverter INV321.

To be more specific, the slew latch circuit LTC 321 outputs the enable signal CLKEN without change when the drive clock PLLCLK is at the low level.

When the drive clock PLLCLK is at the high level, the slew latch circuit LTC 321 outputs an enable signal value at a point of time immediately before the drive clock PLLCLK changes from the low level to the high level.

The logic gate LGT made up of the NAND gate NAND321 and the inverter INV321 outputs a high-level clock GCLK only when the output signal of the slew latch circuit LTC321 is at the high level and the drive clock PLLCLK is at the high level.

The logic gate LGT outputs the clock GCLK at the low level in the following cases.

The logic gate LGT outputs a low-level clock GCLK when the output signal of the slew latch circuit LTC321 is at the high level and the drive clock PLLCLK is at the low level.

Alternatively, the logic gate LGT outputs the low-level clock GCLK when the output signal of the slew latch circuit LTC321 is at the low level and the drive clock PLLCLK is also at the low level.

Figure 11:
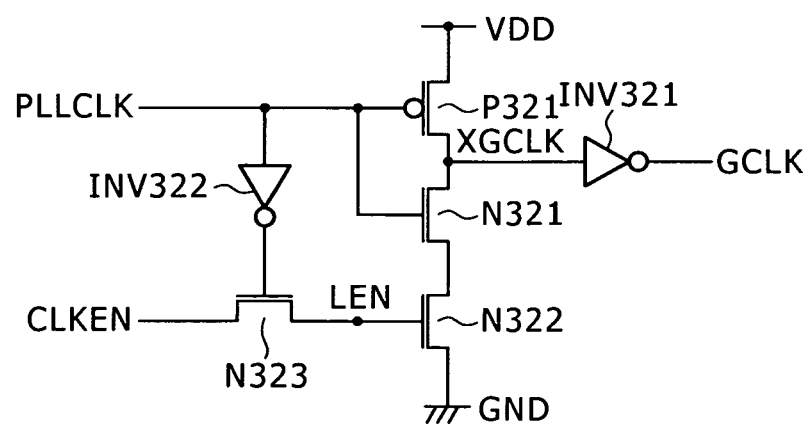
FIG. 11 is a circuit diagram illustrating a specific exemplary configuration of the clock enabler shown in FIG. 10.

Referring to FIG. 11, there is shown a circuit diagram illustrating a specific exemplary configuration of the clock enabler shown in FIG. 10.

The circuit of the clock enabler 320a shown in FIG. 11 is made up of a PMOS transistor P321, NMOS transistors N321 through N323, and inverters INV321 and INV322.

The PMOS transistor P321 and the NMOS transistors N321 and N322 are connected in series between the supply line of the power supply VDD and ground line GND.

The gates electrodes of the PMOS transistor P321 and the NMOS transistor N321 and the input terminal of the inverter INV322 are connected to the input terminal of the drive clock PLLCLK.

The gate of the NMOS transistor N322 is connected to the input line of the enable signal CLKEN via the NMOS transistor N323.

Next, the gate electrode of the NMOS transistor N323 is connected to the output terminal of the inverter INV322 and the junction between the drain electrodes of the PMOS transistor P321 and the NMOS transistor N321 is connected to the input terminal of the inverter INV 321.

In this circuit, the inverter INV322 and the NMOS transistor N323 form a dynamic slew latch circuit and the PMOS transistor P321 and the NMOS transistors N321 and N322 form a NAND gate.

To be more specific, a circuit in which a node XGCLK is precharged while the drive clock PLLCLK is at the low level and this circuit operates as a NAND while the drive clock PLLCLK is at the high level.

Figure 12:
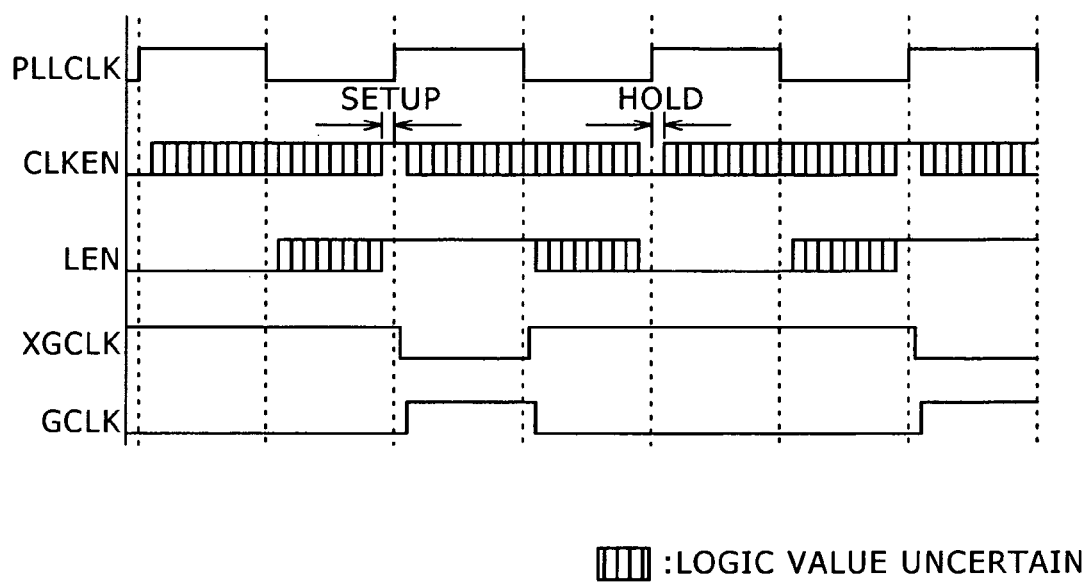
FIG. 12 is a timing chart indicative an operation of the clock enabler shown in FIG. 10 and FIG. 11.

The following describes an operation of the clock enabler 10 having the configuration described above with reference to the timing chart shown in FIG. 12.

First, when the drive clock PLLCLK is at the low level, the NMOS transistor N323 is held in a conducting state in the slew latch circuit LTC321, a value of the enable signal CLKEN being propagated to the node LEN.

When the drive clock PLLCLK goes the high level, the NMOS transistor N323 gets in a non-conductive state, upon which a value of the enable signal CLKEN immediately before the drive clock PLLCLK goes the high level is held in the node LEN while the drive clock PLLCLK is at the high level.

On the other hand, while the drive clock PLLCLK is at the low level, the PMOS transistor P321 is held in a conducting state, so that the junction XGCLK between the drain electrodes of the PMOS transistor P321 and the NMOS transistor N321 is held at the high level.

Next, when the drive clock PLLCLK goes the high level, the PMOS transistor P321 gets in a non-conducting state and the NMOS transistor N321 gets in a conducting state.

Now, if the node LEN is at the high level when the drive clock PLLCLK is at the high level, then the NMOS transistor N322 gets in a conducting state. As a result, the node XGCLK is discharged to go the low level. Therefore, the clock GCLK outputted from the inverter INV321 goes the high level.

Namely, the positive pulse of the drive clock PLLCLK is propagated to the output node to be outputted as a clock GCLK.

If the node LEN is at the low level when the drive clock PLLCLK is at the high level, the NMOS transistor N322 is held in a non-conducting state. As a result, the node XGCLK is not discharged and therefore held at the high level. Therefore, the clock GCLK outputted from the inverter INV321 is held at the low level.

Namely, the positive pulse of the drive clock PLLCLK is prevented from being propagated to the output node.

With respect to the whole circuit, the enable signal CLKEN is sampled at the rising of the drive clock PLLCLK. As a result, the positive pulse immediately after the rising of the drive clock PLLCLK is propagated to the output node or prevented from being propagated to the output node.

As described above, the clock enabler 320 shown in FIG. 10 can turn on/off the output of the drive clock PLLCLK by the PLL circuit 310 without causing a hazard in accordance with the enable signal CLKEN without requiring a complicated control operation.

Namely, the clock enabler 320a can output the clock GCLK several cycles after the enable signal CLKEN going the high level.

The lane blocks 330-0 through 330-3 have dividers 331-0 through 331-3, 10:1 parallel-to-serial converters P/S 332-0 through 332-3, and differential output blocks (DF) 333-0 through 333-3, respectively.

The divider 331-0 of the lane block 330-0 divides the drive clock GCLK supplied from the clock enabler 320 to generate a load signal LOAD30 and a divide clock CLK30, supplying these signals to the parallel-to-serial converter 332-0 of the own lane block.

It should be noted that the divider 331-0 is reset by a reset signal RSTX30.

The divide clock CLK30 of the divider 331-0 is also used as a system clock of the logic layer block 200.

The parallel-to-serial converter 332-0 of the lane block 330-0 latches 10-bit data PDATA10 for example of the corresponding lane to the first latch as data PDATALT30 in synchronization with the divide clock CLK30 generated by the divider 331-0.

The parallel-to-serial converter 332-0 latches the latch data PDATALT30 to the second latch in synchronization with the drive clock GCLK while the load signal LOAD30 generated by the divider 331-0 is at the high level.

The parallel-to-serial converter 332-0 shifts the second latch data in synchronization with the drive clock GCLK after switching of the load signal LOAD30 to the low level, thereby outputting the shifted data from the different output block 333-0 as differential serial data TX30.

The divider 331-1 of the lane block 330-1 divides the drive clock GCLK supplied from the clock enabler 320 to generate a load signal LOAD31 and a divide clock CLK31 and supplies these signals to the parallel-to-serial converter 332-1 of the own lane block.

It should be noted that the divider 331-1 is reset by the reset signal RSTX31.

The parallel-to-serial converter 332-1 of the lane block 330-1 latches 10-bit data PDATA11 for example of the corresponding lane to the first latch as data PDATALT31 in synchronization with the divide clock CLK31 generated by the divider 331-1.

The parallel-to-serial converter 332-1 latches the latch data PDATALT31 to the second latch in synchronization with the drive clock GCLK while the load signal LOAD31 generated by the divider 331-1 is at the high level.

The parallel-to-serial converter 332-1 shifts the second latch data in synchronization with the drive clock GCLK after switching of the load signal LOAD31 to the low level, thereby outputting the shifted data from the different output block 333-1 as differential serial data TX31.

The divider 331-2 of the lane block 330-2 divides the drive clock GCLK supplied from the clock enabler 320 to generate a load signal LOAD32 and a divide clock CLK32 and supplies these signals to the parallel-to-serial converter 332-2 of the own lane block.

It should be noted that the divider 331-2 is reset by the reset signal RSTX32.

The parallel-to-serial converter 332-2 of the lane block 330-2 latches 10-bit data PDATA12 for example of the corresponding lane to the first latch as data PDATALT32 in synchronization with the divide clock CLK32 generated by the divider 331-2.

The parallel-to-serial converter 332-2 latches the latch data PDATALT32 to the second latch in synchronization with the drive clock GCLK while the load signal LOAD32 generated by the divider 331-2 is at the high level.

The parallel-to-serial converter 332-2 shifts the second latch data in synchronization with the drive clock GCLK after switching of the load signal LOAD32 to the low level, thereby outputting the shifted data from the different output block 333-2 as differential serial data TX32.

The divider 331-3 of the lane block 330-3 divides the drive clock GCLK supplied from the clock enabler 320 to generate a load signal LOAD33 and a divide clock CLK33 and supplies these signals to the parallel-to-serial converter 332-3 of the own lane block.

It should be noted that the divider 331-3 is reset by the reset signal RSTX33.

The parallel-to-serial converter 332-3 of the lane block 330-3 latches 10-bit data PDATA13 for example of the corresponding lane to the first latch as data PDATALT33 in synchronization with the divide clock CLK33 generated by the divider 331-3.

The parallel-to-serial converter 332-3 latches the latch data PDATALT33 to the second latch in synchronization with the drive clock GCLK while the load signal LOAD33 generated by the divider 331-3 is at the high level.

The parallel-to-serial converter 332-3 shifts the second latch data in synchronization with the drive clock GCLK after switching of the load signal LOAD33 to the low level, thereby outputting the shifted data from the different output block 333-3 as differential serial data TX33.

Figure 13:
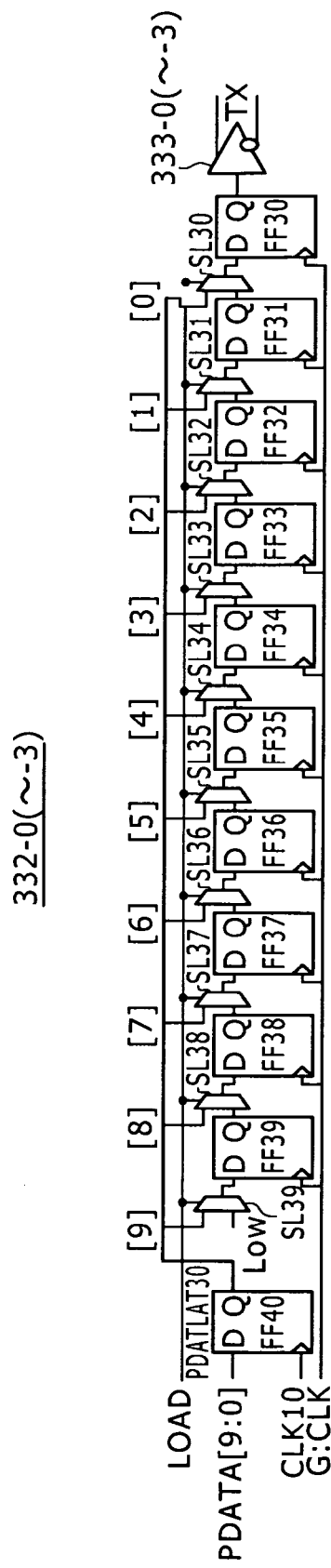
FIG. 13 is a circuit diagram illustrating an exemplary configuration of a parallel-to-serial converter practiced as the embodiment of the present disclosure.

Referring to FIG. 13, there is shown an exemplary configuration of a parallel-to-serial converter associated with the present embodiment.

Figure 14:
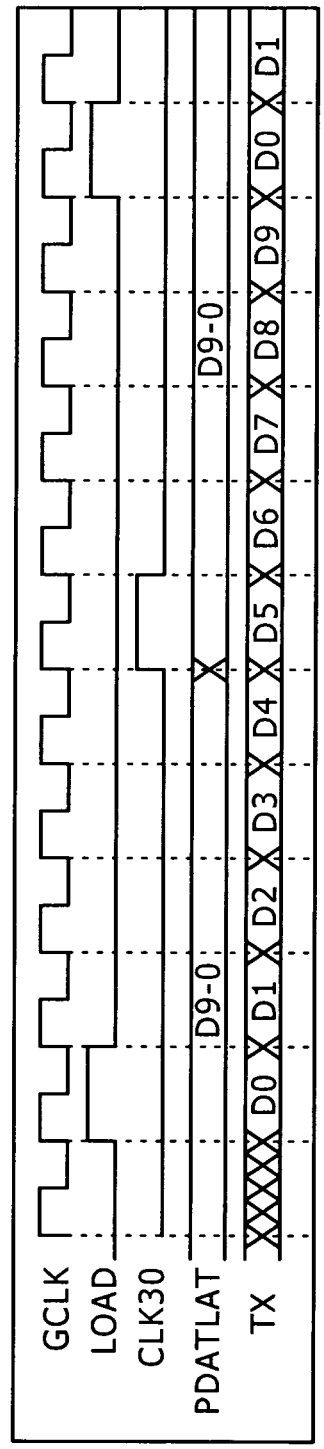
FIG. 14 is a timing chart indicative of an operation of the parallel-to-serial converter shown in FIG. 13.

Referring to FIG. 14, there is shown a timing chart indicative of an operation of the parallel-to-serial converter shown in FIG. 13.

It should be noted that this parallel-to-serial converter is described below as the parallel-to-serial converter 332-0 in the lane block 330-0; the parallel-to-serial converters 332-1 through 332-3 of the other lane blocks 330-1 through 330-3 have the same configuration as that of the parallel-to-serial converter 332-0.

The parallel-to-serial converter (P/S) 332-0 (through 332-3) shown in FIG. 13 has flip-flops FF30 through FF39 as the second latch, a flip-flop FF40 as the second latch, and selectors SL30 through SL39.

The parallel-to-serial converter 332-0 (through 332-3) has the flip-flop FF40 at the data input stage.

The flip-flop FF40 is supplied with parallel data PDATA from the logic layer block 200 at the data input D and latches data PDATA10 (through PDATA13) in synchronization with divide clock CLK30 (through CLK33) from the divider 331-0 (through 331-3), outputting the latched data.

The data output Q of the flip-flop FF40 is connected to the first input terminal of the selectors SL39 through SL30.

The selectors SL39 through SL30 select the output data of the first input terminal, namely, the flip-flop FF40, when the load signal LOAD 30 (through 33) from the divider 331-0 (through 331-3) is at the high level and selects the input data of the second input terminal when this load signal is at the low level.

The flip-flops FF39 through FF30 are connected in a cascaded manner, with the drive clock GCLK from the clock enabler 320 being supplied to the clock input of each flop-flop.

The data input D of the flip-flop FF39 is connected to the output terminal of the selector SL39 and the second input terminal of the selector SL39 is fixed to the low level.

The data input D of the flip-flop FF38 is connected to the output terminal of the selector SL38 and the second input terminal of the selector SL38 is connected to the data output Q of the flip-flop FF39.

The data input D of the flip-flop FF37 is connected to the output terminal of the selector SL37 and the second input terminal of the selector SL37 is connected to the data output Q of the flip-flop FF38.

The data input D of the flip-flop FF36 is connected to the output terminal of the selector SL36 and the second input terminal of the selector SL36 is connected to the data output Q of the flip-flop FF37.

The data input D of the flip-flop FF35 is connected to the output terminal of the selector SL35 and the second input terminal of the selector SL35 is connected to the data output Q of the flip-flop FF36.

The data input D of the flip-flop FF34 is connected to the output terminal of the selector SL34 and the second input terminal of the selector SL34 is connected to the data output Q of the flip-flop FF35.

The data input D of the flip-flop FF33 is connected to the output terminal of the selector SL33 and the second input terminal of the selector SL33 is connected to the data output Q of the flip-flop FF34.

The data input D of the flip-flop FF32 is connected to the output terminal of the selector SL32 and the second input terminal of the selector SL32 is connected to the data output Q of the flip-flop FF33.

The data input D of the flip-flop FF31 is connected to the output terminal of the selector SL31 and the second input terminal of the selector SL31 is connected to the data output Q of the flip-flop FF32.

The data input D of the flip-flop FF30 is connected to the output terminal of the selector SL30 and the second input terminal of the selector SL30 is connected to the data output Q of the flip-flop FF31.

Then, the data output Q of the flip-flop FF30 is connected to the input terminal of the differential output block 333-0 (through 333-3).

In the parallel-to-serial converter 332-0 (through 332-3), data PDATA of the corresponding lane is latched in synchronization with the divide clock CLK30 generated by the divider 331-0 and the latched data PDATALT is outputted to the first input terminals of the selectors SL39 through SL30.

Then, while the load signal LOAD30 (through LOAD33) is at the high level, the latched data PDATALT is latched to the flip-flops FF39 through FF30 in synchronization with the drive clock GCLK.

The latch data of the flip-flops 39 through 30 is shifted in synchronization with the drive clock GCLK after the switching of load signal LOAD30 (through LOAD33) to the low level and the shifted latch data is outputted from the differential output block 333-0 (through 333-3) as differential serial data TX30.

Figure 15:
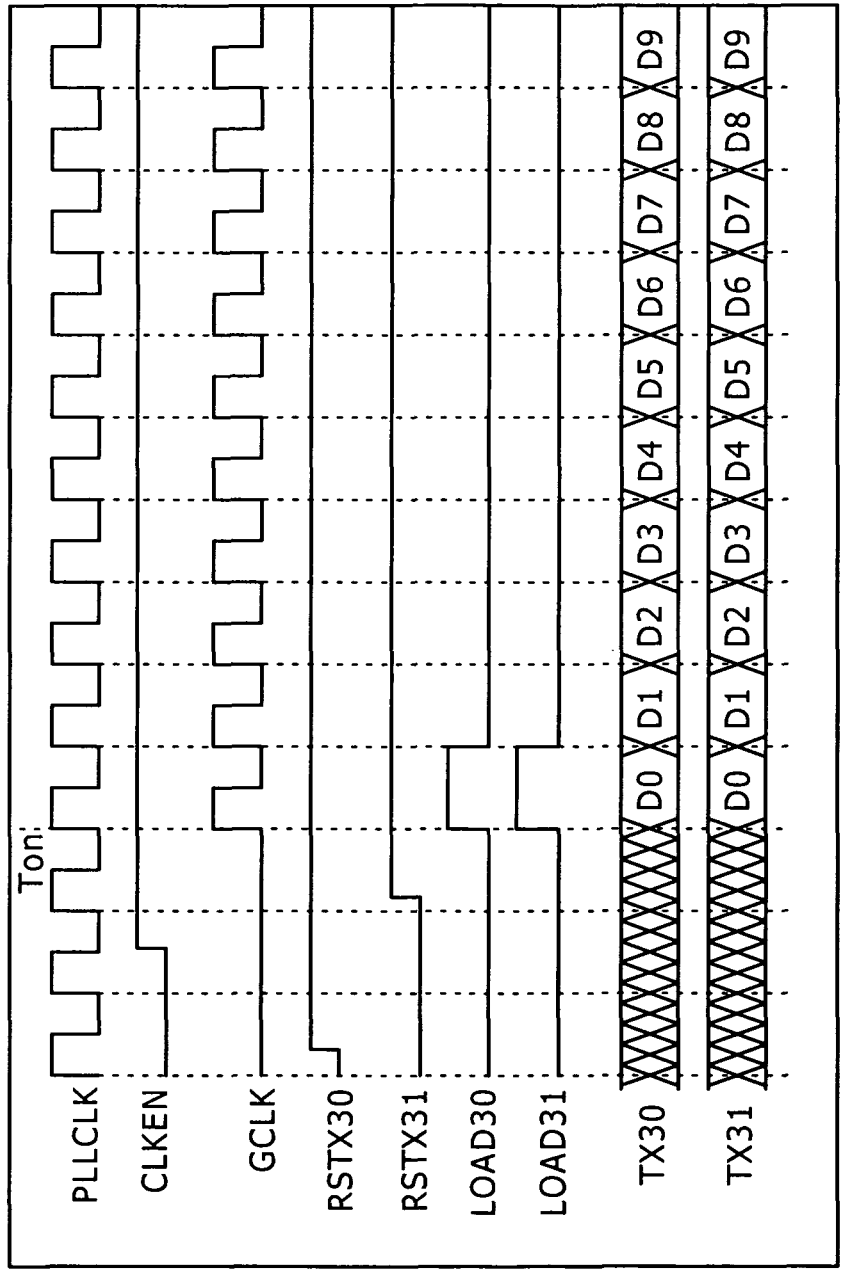
FIG. 15 is a timing chart indicative of an operational overview of the transmission circuit practiced as the embodiment of the present disclosure.

Referring to FIG. 15, there is shown a timing chart indicative of an operational outline of a transmission circuit associated with the present embodiment.

In the present embodiment, so-called individual dividers and a clock gating scheme are used.

In the present embodiment, a clock enabler block (or a clock gate) 320 is arranged in the rear of the output block of the drive clock PLLCLK that is the output of the PLL circuit 310 having the highest frequency among the clocks.

The clock enabler block 320 is configured as a circuit of turning on/off the clock without causing a hazard in accordance with the enable signal CLKEN.

As shown in FIG. 15, when the enable signal CLKEN goes the high level, the clock GCLK is outputted several cycles later. Next, the drive clock GCLK is distributed to the dividers 331-0 through 331-3 as the drive clock of the lane blocks 330-0 through 330-3. Obviously, a minimum distribution skew is desired.

On the other hand, for the reset signal for the dividers 331-0 through 331-3, RSTX30, RSTX31, RSTX32, and RSTX33 are entered for these dividers, respectively. These reset signals may be entered any time before timing. Ton with which the drive signal GCLK is turned ON; thus the timing restrictions of these reset signals are not strict.

For example, the reset signal RSTX30 of the lane block 330-0 is cleared fairly before the reset signal RSTX31 of the lane block 330-1.

However, because the drive clock GCLK is OFF, the divide operation of the lane block 330-0 does not start; after the resetting of the lane block 330-1 is cleared by the reset signal RSTX31, the divide operations of both lane blocks start at the same time when the drive signal GCLK is turned ON.

For this reason, the output data of the parallel-to-serial converters 332-0 and the output data of the parallel-to-serial converter 332-1 can also be synchronized.

In addition, with the clocks on the side of the logic layer block 200, only one divide clock (CLK30 in FIG. 9) of a given lane block can be selected as a system clock because there is no inter-lane skew.

<3. An Example in which Clock Enablers are Arranged in a Tree Structure>

Figure 16:
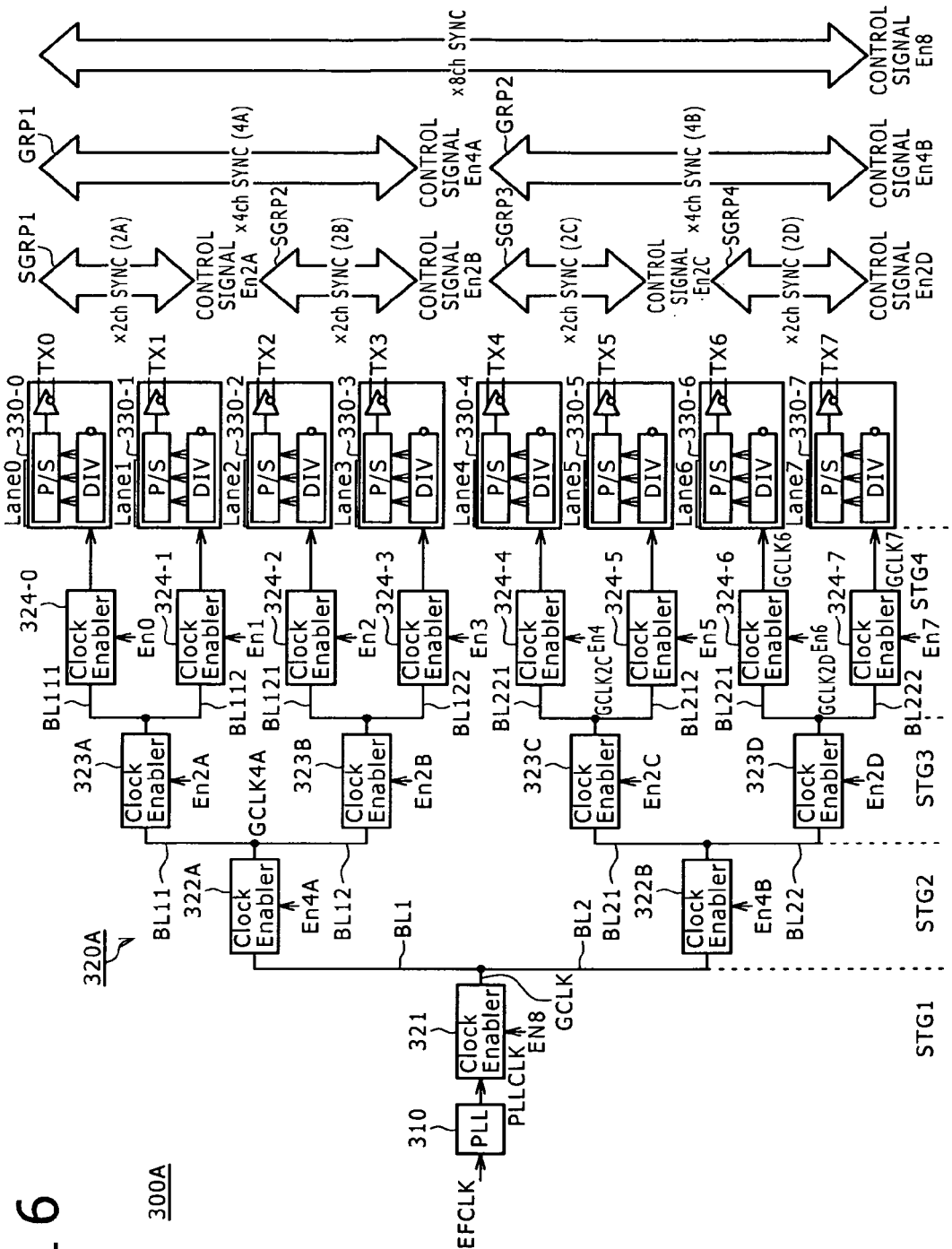
FIG. 16 is a circuit diagram of one example of the transmission circuit with the clock enablers practiced as the embodiment of the present disclosure arranged in a tree structure.

Referring to FIG. 16, there is shown an example of a transmission circuit associated with the present embodiment with clock enablers arranged in a tree structure.

It should be noted that FIG. 16 shows an example in which the number of lanes n is eight, higher than the four shown in FIG. 9.

This transmission circuit 300A has eight lane blocks 330-0 through 330-7 arranged in parallel.

These eight lane blocks 330-0 through 330-7 are divided into two or more groups, in this example, two groups; the first lane group GRP1 and the second lane group GRP2.

The first lane group GRP1 includes the four consecutive lane blocks 330-0 through 330-3.

The first lane group GRP1 is further divided into a first sub lane group SGRP1 and a second sub lane group SGRP2.

The first sub lane group SGRP1 includes the two consecutive lane blocks 330-0 and 330-1.

The second sub lane group SGRP2 includes the two lane blocks 330-2 and 330-3.

The second lane group GRP2 includes the four consecutive lane blocks 330-4 through 330-7.

The second lane group GRP2 is further divided into a third sub lane group SGRP3 and a fourth sub lane group SGRP4.

The third sub lane group SGRP3 includes the two consecutive lanes blocks 330-4 and 330-5.

The fourth sub lane group SGRP4 includes the two lane blocks 330-6 and 330-7.

In the clock enabler block 320A of the transmission circuit 300A shown in FIG. 16, two or more, 15 in this example, clock enablers 321, 322A, 322B, 323A through 323D, and 324-0 through 324-7 are arranged in a multiple-stage, namely, a four-stage tree structure.

In the present embodiment, the clock enabler block 320A basically has two or more clock enablers in a tree structure having at least two stages.

With the clock enabler block 320A, the output path of the output drive clock of the clock enabler arranged in the front stage is branched to two or more branch paths. A clock enabler in the next stage is arranged to at least one of the branch paths from the front stage.

As described above, if two or more lane blocks 330-0 through 330-7 are divided into two or more lane groups, the clock enablers are basically arranged as described below.

With the clock enabler block 320A, the output path of the output drive clock of the clock enabler 321 in the front stage to which a reference drive clock is supplied is branched into branch paths BL1 and BL2 corresponding to the number of groups of lane groups (two in this example).

In the clock enabler block 320A, the clock enablers of the next stage are arranged to the two or more branch paths from the front stage, respectively, the output drive clocks of the clock enablers of the next stage being supplied to the lane blocks of the lane groups of the subsequent stage.

As described above, if two or more lane groups are further divided into sub groups, the following arrangement is basically provided.

With the clock enabler block 320A, the output path of the output drive clock of each clock enabler in the next stage that is the preceding stage of the succeeding stage is branched into the number of branch paths equal to the number of sub groups of the each lane group.

Then, in the clock enabler block 320A, the clock enablers of the succeeding stage are arranged to the two or more branch paths branched from the preceding stage, respectively. The output clock of each of the clock enabler of the succeeding stage is supplied to the lane block of the corresponding sub lane group.

In the present embodiment, if the lane blocks are synchronized in units of all lane blocks, lane group, or sub group, the clock enabler block 320A execute control on two or more clock enablers as follows.

The clock enabler block 320A controls the output of the drive clock of the clock enabler arranged at the junction of branches of the output drive clock in response to the enable signal, controlling the other clock enablers to a clock output state (or fixed to the high level).

In synchronizing all lane blocks 330-0 through 330-7, the clock enabler block 320A controls the output of the drive clock of the clock enabler 321 to which a reference drive clock is supplied, in response to the enable signal. Then, the clock enabler block 320A controls the other clock enablers to the clock output state.

In achieving synchronization in unit of the lane group GRP1 and lane group GRP2, the clock enabler block 320A executes control as follows.

Of the clock enablers arranged along the branch paths obtained in the number corresponding to the number of lane groups, the clock enabler block 320A controls the output of the drive clock of the clock enabler corresponding to the lane group to be synchronized with this clock enabler, in response to the enable signal. Then, the clock enabler block 320A controls the other clock enablers to the clock output state.

If synchronization is achieved in unit of sub lane group, the clock enabler block 320A executes control as follow.

Of the clock enablers arranged along the branch paths obtained in the number corresponding to the number of sub lane groups, the clock enabler block 320A controls the output of the drive clock of the clock enabler corresponding to the sub lane group to be synchronized with this clock enabler, in response to the enable signal. Then, the clock enabler block 320A controls the other clock enablers to the clock output state.

As described above, in the clock enabler block 320A, 15 clock enablers 321, 322A, 322B, 323A through 323D, and 324-0 through 324-7 are arranged in a tree structure having multiple four stages.

In the first stage STG1, the clock enabler 321 is arranged. This clock enabler 321 is supplied with a drive clock PLLCLIK by the PLL circuit 310.

The clock enabler 321 is supplied with an enable signal EN8 and handled as the central clock enabler when control is executed to synchronize all the lane blocks 330-0 through 330-7.

The output path of the output drive clock GCLK of the clock enabler 321 is branched into two branch paths BL1 and BL2 corresponding to the number of lane groups.

Then, the branch path BL1 is arranged with the clock enabler 322A corresponding to the first lane group GRP1, as the second stage STG2.

The clock enabler 322A is supplied with an enable signal En4A and is handled as the central clock enabler when control is executed to synchronize the first lane group GRP1.

Likewise, the branch path BL2 is arranged with the clock enabler 322B corresponding to the second lane group GRP2, as the second stage STG2.

The clock enabler 322B is supplied with an enable signal En4B and handled as the central clock enabler when control is executed to synchronize the second lane group GRP2.

The output path of the output drive clock GCLK4A of the clock enabler 322A is branched into two branch paths BL11 and BL12 corresponding to the number of sub lane groups (two).

The output path of the output drive clock GCLK4B of the clock enabler 322B is branched into two branch paths BL21 and BL22 corresponding to the number of sub lane groups (two).

The branch path BL11 is arranged with the clock enabler 323A corresponding to the first sub lane group SGRP1 as the third stage STG3.

The clock enabler 323A is supplied with an enable signal En2A and handled as the center clock enabler when control is executed to synchronize the first sub lane group SGRP1.

Likewise, the branch path BL12 is arranged with the clock enabler 323B corresponding to the second sub lane group SGRP2 as the third stage STG3.

The clock enabler 323B is supplied with an enable signal En2B and handled as the center clock enabler when control is executed to synchronize the second sub lane group SGRP2.

In addition, the branch path BL21 is arranged with the clock enabler 323C corresponding to the third sub lane group SGRP3, as the third stage STG3.

The clock enabler 323C is supplied with an enable signal En2C and handled as the center clock enabler when control is executed to synchronize the third sub lane group SGRP3.

Likewise, the branch path BL22 is arranged with the clock enabler 323D corresponding to the fourth sub lane group SGRP4, as the third stage STG3.

The clock enabler 323D is supplied with an enable signal En2D and handled as the center clock enabler when control is executed to synchronize the fourth sub lane group SGRP4.

The output path of the output drive clock GCLK2A of the clock enabler 323A is branched into two branch paths BL111 and BL112 corresponding to the number of lane blocks (two) of the first sub lane group SGRP1.

The output path of the output drive clock GCLK2B of the clock enabler 323B is branched into two branch paths BL121 and BL122 corresponding to the number of lane blocks (two) of the second sub lane group SGRP2.

The output path of the output drive clock GCLK2C of the clock enabler 323C is branched into two branch paths BL211 and BL212 corresponding to the number of lane blocks (two) of the third sub lane group SGRP3.

The output path of the output drive clock GCLK2D of the clock enabler 323D is branched into two branch paths BL221 and BL222 corresponding to the number of lane blocks (two) of the fourth sub lane group SGRP4.

The branch path BL111 is arranged with the clock enabler 324-0 corresponding to the lane block 330-0, as the fourth stage STG4. The clock enabler 324-0 is supplied with an enable signal En0.

The branch path BL112 is arranged with the clock enabler 324-1 corresponding to the lane block 330-1, as the fourth stage STG4. The clock enabler 324-1 is supplied with an enable signal En1.

The branch path BL121 is arranged with the clock enabler 324-2 corresponding to the lane block 330-2, as the fourth stage STG4. The clock enabler 324-2 is supplied with an enable signal En2.

The branch path BL122 is arranged with the clock enabler 324-3 corresponding to the lane block 330-3, as the fourth stage STG4. The clock enabler 324-3 is supplied with an enable signal En3.

The branch path BL211 is arranged with the clock enabler 324-4 corresponding to the lane block 330-4, as the fourth stage STG4. The clock enabler 324-4 is supplied with an enable signal En4.

The branch path BL212 is arranged with the clock enabler 324-5 corresponding to the lane block 330-5, as the fourth stage STG4. The clock enabler 324-5 is supplied with an enable signal En5.

The branch path BL221 is arranged with the clock enabler 324-6 corresponding to the lane block 330-6, as the fourth stage STG4. The clock enabler 324-6 is supplied with an enable signal En6.

The branch path BL222 is arranged with the clock enabler 324-7 corresponding to the lane block 330-7, as the fourth stage STG4. The clock enabler 324-7 is supplied with an enable signal En7.

As described above, in the last stage that is the fourth stage STG4, the clock enabler block 320A is arranged with the clock enablers 324-0 through 324-7 so as to correspond to two or more lane blocks 330-0 through 330-7 on a one-to-one basis.

Referring to FIG. 17, there is shown a control matrix indicative of a method of controlling the enable signals to be supplied to the clock enablers corresponding to the number of lane blocks to be synchronized in the transmission circuit shown in FIG. 16.

In FIG. 17, "Control" is indicative of controlling of the clock output of each clock enabler in accordance with an enable signal and "fixed to High" is indicative of fixing the enable signal so that the clock enabler is put in a normally clock output state.

[Synchronizing all Eight Lane Blocks 330-0 Through 330-7 (×8ch)]

If all eight lane blocks 330-0 through 330-7 are synchronized, an enable signal EN8 to the central clock enabler 321 is controlled to fix an enable signal to the other clock enablers to the high level.

[Synchronizing in Unit of Lane Group (×4ch 4A/4B)]

If lane blocks are synchronized in unit of lane group, in other words, in unit of four lane blocks, an enable signal En4A or En4B or both thereof to the clock enabler 322A or 322B are controlled to fix the enable signals to other clock enablers to the high level.

[Synchronizing in Unit of Sub Lane Group (×2ch 2A/2B/2C/2D)]

If lanes blocks are synchronized in unit of sub lane group, in other words, in unit of two lane blocks, any one of or two or more (including all) enable signals En2 through En2D to the clock enablers 323A through 323D are controlled to fix the enable signals to other clock enablers to the high level.

In addition to the operation modes mentioned above, there are many operation modes; the operation common to these modes is the control of the clock enabler that is at the central point in a lane group to be synchronized.

Figure 18:
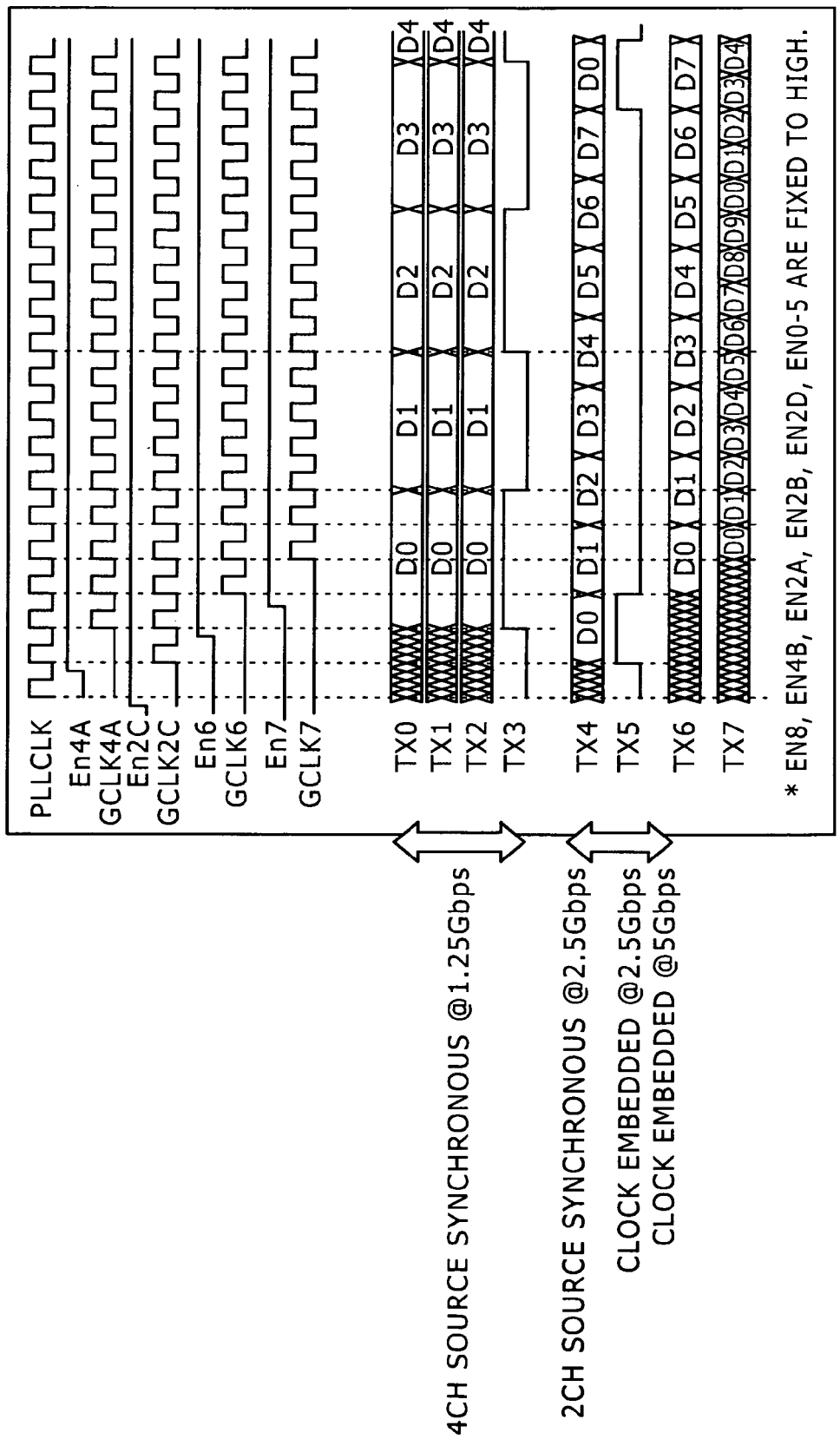
FIG. 18 is a timing chart indicative that different transmission modes and different transmission data rates may exist at the same time by setting the dividers on a lane block individual division basis in the transmission circuit practiced as one embodiment of the present disclosure.

Referring to FIG. 18, there is shown a timing chart indicative that, in the transmission circuit practiced as the present embodiment, different transmission modes and different transmission data rates can exist at the same time by executing the setting of individual division of lane blocks of a divider.

In addition, as shown in FIG. 18, the individual division setting of the lane blocks 330-0 through 330-7 of the divider allows the coexistence of different transmission modes and different transmission data rates. The following control can be executed as an example.

The lane blocks 330-0 through 330-3 (the first lane group GRP1) are realized as 4ch source synchronous (double data rate) transmission (×4ch (4A)) at 1.25 Gbps.

In this case, an enable signal En4A to the clock enabler 322A is controlled.

The lane blocks 330-4 and 330-5 (the third sub lane group SGRP3) are realized as 2ch source synchronous (octal data rate) transmission (×2ch (2C)) at 2.5 Gbps.

In this case, an enable signal En2C to the clock enabler 323C is controlled.

The lane block 330-6 is realized at 1ch clock embedded transmission at 2.5 Gpbs.

In this case, an enable signal En6 to the clock enabler 324-6 is controlled.

The lane block 330-7 is realized as 1ch clock embedded transmission at 5 Gbps.

In this case, an enable signal En7 to the clock enabler 324-7 is controlled.

It should be noted that an enable signal EN8 to the clock enabler 321 that is not controlled as normally enabled and an En4B to the clock enabler 322B are fixed to the high level.

Likewise, an enable signal En2A to the clock enabler 323A, an enable signal En2B to the clock enabler 323B, and an enable signal En2D to the clock enabler 323D are fixed to the high level.

Further, enable signals En0 through En5 to the clock enablers 324-0 through 324-5 are fixed to the high level.

As described above, in the transmission circuit of a data interface having two or more lanes (or channels), a flexible configuration can be provided in which different transmission modes and different data rates exist at the same time for different lanes.

Obviously, multiple stages of enablers arranged along high-speed clock wiring may cause jitters to lower the transmission quality, so that some configurations need not always arrange the enablers in a tree structures; if the transmission quality is prioritized, some enablers may be omitted.

However, those enablers which are at the centers of the lanes at least requiring synchronization must be arranged.

As described above and according to the embodiments of the disclosure, the following effects can be obtained.

Because the timing restrictions of the control signals to be distributed in order to provide synchronization between two or more transmission lanes are mitigated, the number of design processes can be reduced. In addition, the simplified deskew circuit on the reception side is advantageous in power dissipation and circuit scale.

Besides, the proper control of clock enablers arranged in a tree structure allows the arrangement of flexible transmission configurations (transmission modes and the transmission rates) having a same circuit configuration independent of lanes. This novel setup eliminates the necessity of the redesign otherwise required every time specifications are changed, thereby further reducing the number of design processes.

<4. A Communication System Including a Transmission Circuit and a Reception Circuit>

Figure 19:
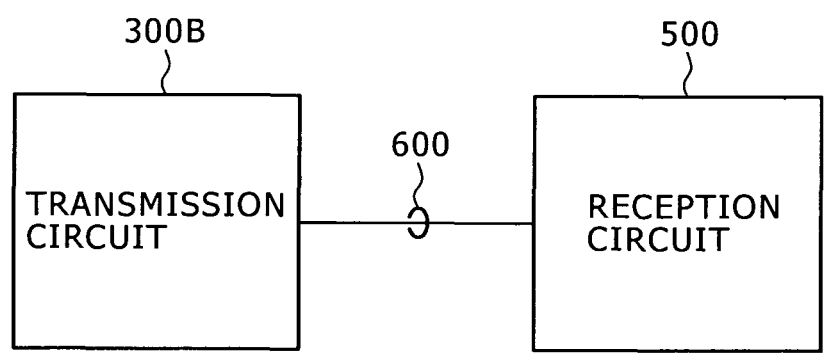
FIG. 19 is a block diagram illustrating a basic configuration of a communication system practiced as one embodiment of the present disclosure.

Referring to FIG. 19, there is shown a basic configuration of a communication system practiced as one embodiment of the disclosure.

A communication system 400 has a transmission circuit 300B to which any one of the transmission circuits shown in FIG. 9 and FIG. 16 for example is applied and a reception circuit 500. The transmission circuit 300B and the reception circuit 500 are interconnected with a communication cable 600.

The transmission circuit 300B transmits two or more phase-locked serial data signals for example to the reception circuit 500.

The reception circuit 500 receives serial data signals transmitted over the communication cable 600, thereby executing processing synchronized with a recovery clock.

The communication system 400 described above, to which the transmission circuit shown in FIG. 9 or FIG. 16 for example is applied, provides substantially the same effects and advantages as those mentioned above.

To be more specific, because the timing restrictions of the control signals to be distributed in order to provide synchronization between two or more transmission lanes are mitigated, the number of design-processes can be reduced. In addition, the simplified deskew circuit on the reception side is advantageous in power dissipation and circuit scale.

Besides, the proper control of clock enablers arranged in a tree structure allows the arrangement of flexible transmission configurations (transmission modes and the transmission rates) having a same circuit configuration independent of lanes. This novel setup eliminates the necessity of the redesign otherwise required every time specifications are changed, thereby further reducing the number of design processes.

The present disclosure contains subject matter related to that disclosed in Japanese Priority Patent Application JP 2010-178721 filed in the Japan Patent Office on Aug. 9, 2010, the entire content of which is hereby incorporated by reference.

While preferred embodiments of the present disclosure have been described using specific terms, such description is for illustrative purpose only, and it is to be understood that changes and variations may be made without departing from the spirit or scope of the following claims.

What is claimed is:

1. A transmission circuit comprising:
a plurality of lane blocks arranged in parallel to each other configured to convert parallel data supplied from a corresponding lane into serial data and output said serial data; and
a clock enabler block including at least one clock enabler for outputting a drive clock phase-locked with a reference clock to said plurality of lane blocks after a plurality of cycles of said reference clock in response to an enable signal;
each of said plurality of lane blocks comprising:
a divider for dividing said drive clock supplied from said clock enabler block to generate a divide clock and a load signal; and
a parallel-to-serial converter for converting said parallel data supplied from said corresponding lane into said serial data in synchronization with said divide clock and said load signal generated by said divider and said drive clock generated by said clock enabler block,
wherein said plurality of lane blocks are grouped into a plurality of lane groups; and
in said clock enabler block:
a plurality of clock enablers are arranged in a tree structure of two stages;
an output path of an output drive clock of a clock enabler in a preceding stage of said two stages to which said reference clock is supplied is branched to a number of branches equivalent to a number of groups of said plurality of lane groups; and
clock enablers of said plurality of clock enablers of a succeeding stage of said two stages are arranged to a plurality of branches extending from said preceding stage and output drive clocks of said clock enablers of said succeeding stage are supplied to lane blocks of corresponding lane group,
wherein, said clock enabler block, for synchronizing said lane blocks on said lane group:
controls said output drive clock in accordance with said enable signal of a clock enabler of said plurality of clock enablers corresponding to said lane group subject to synchronization arranged on a branch path to be branched into said number of groups of said lane group; and
controls another clock enabler of said plurality of clock enablers into a clock output state.

2. The transmission circuit according to claim 1, wherein, in said clock enabler block:
said output path of said output drive clock of said clock enabler arranged in said preceding stage of said two stages is branched into a plurality of branch paths; and
a clock enabler of said succeeding stage of said two stages is arranged for at least one of said plurality of branch paths extending from said preceding stage.

3. The transmission circuit according to claim 1,
wherein at least one of said plurality of lane groups are further divided into sub lane groups; and
in said clock enabler block:
with each of the clock enablers of said succeeding stage being as said clock enabler in said preceding stage, an output path of an output drive clock of each of said clock enablers of said succeeding stage is branched into the number of branch paths corresponding to the number of said sub lane groups of said lane group; and
multiple clock enablers of said plurality of said clock enablers are arranged to the plurality of branch paths extending from said preceding state and output drive clocks of said multiple clock enablers of said succeeding stage are supplied to the lane blocks of a corresponding sub lane group.

4. The transmission circuit according to claim 1, wherein, in said clock enabler block:
said preceding stage being a first stage to which said reference clock is supplied; and
said succeeding stage being a last stage, said clock enablers of plurality of clock enablers of said succeeding stage are arranged to said plurality of lane blocks on a one-to-one basis.

5. The transmission circuit according to claim 1, wherein said clock enabler block controls said enable signal of each clock enabler of said plurality of clock enablers to synchronize said lane blocks corresponding to said lane group and/or synchronize a sub group of lane blocks corresponding to a sub lane group, and
said synchronized lane blocks and/or said synchronized sub group of lane blocks transmit data at a rate different from other lane blocks of said plurality of lane blocks.

6. The transmission circuit according to claim 1, wherein a divide value of said divider in each of said plurality of lane blocks is set individually.

7. The transmission circuit according to claim 1, wherein said at least one clock enabler comprises:
a slew latch to generate a high level output or a low level output based on said drive clock and said enable signal; and
an inverter with input connected to output of a two input NAND gate, wherein input to said two input NAND gate are connected to output of said slew latch and said drive clock.

8. The transmission circuit according to claim 7, wherein output of said at least one clock enabler is high when both said drive clock and output of said slew latch are high.

9. The transmission circuit according to claim 7, wherein output of said at least one clock enabler is low when said drive clock is low and output of said slew latch is low.

10. The transmission circuit according to claim 7, wherein output of said at least one clock enabler is low when said drive clock is low and output of said slew latch is high.

11. The transmission circuit according to claim 1,
wherein said plurality of lane blocks are grouped into a plurality of lane groups,
wherein at least one of said plurality of lane groups is grouped into a plurality of sub lane groups.

12. The transmission circuit according to claim 11, wherein data transmission rate of lane blocks in one of said plurality of lane groups is different from another of said plurality of lane groups.

13. The transmission circuit according to claim 11, wherein data transmission rate of lane blocks in one of said plurality of sub lane groups is different from another of said plurality of sub lane groups.

14. The transmission circuit according to claim 1, wherein data transmission rate of each of said plurality of lane blocks is set individually 15. A transmission circuit comprising:
a plurality of lane blocks arranged in parallel to each other configured to convert parallel data supplied from a corresponding lane into serial data and output said serial data; and
a clock enabler block including at least one clock enabler for outputting a drive clock phase-locked with a reference clock to said plurality of lane blocks after a plurality of cycles of said reference clock in response to an enable signal;
each of said plurality of lane blocks comprising:
a divider for dividing said drive clock supplied from said clock enabler block to generate a divide clock and a load signal; and
a parallel-to-serial converter for converting said parallel data supplied from said corresponding lane into said serial data in synchronization with said divide clock and said load signal generated by said divider and said drive clock generated by said clock enabler block,
wherein said plurality of lane blocks are grouped into a plurality of lane groups; and
in said clock enabler block:
a plurality of clock enablers are arranged in a tree structure of two stages,
an output path of an output drive clock of a clock enabler in a preceding stage of said two stages to which said reference clock is supplied is branched to a number of branches equivalent to a number of groups of said plurality of lane groups, and
clock enablers of said plurality of clock enablers of a succeeding stage of said two stages are arranged to a plurality of branches extending from said preceding stage and output drive clocks of said clock enablers of said succeeding stage are supplied to lane blocks of a corresponding lane group,
wherein, said clock enabler block,
in synchronizing all lane blocks:
controls said output drive clock in accordance with said enable signal of a clock enabler of said plurality of clock enablers to which said reference clock is supplied, and
controls another clock enabler of said plurality of clock enablers into a clock output state.

16. The transmission circuit according to claim 15, wherein, in synchronizing said plurality of lane blocks on a lane block basis, said clock enabler block:
controls an output of a drive clock in accordance with said enable signal of said clock enabler of said plurality of clock enablers; and
controls said another clock enabler of said plurality of clock enablers into a clock output state.

17. A communication system comprising:
a transmission circuit configured to convert parallel data into serial data and to transmit said serial data; and
a reception circuit configured to receive said transmitted serial data,
wherein said transmission circuit comprises:
a plurality of lane blocks arranged in parallel to each other configured to convert said parallel data supplied from a corresponding lane into said serial data and output said converted serial data; and
a clock enabler block including at least one clock enabler for outputting a drive clock phase-locked with a reference clock to said plurality of lane blocks after a plurality of cycles of said reference clock in response to an enable signal,
each of said plurality of lane blocks comprising:
a divider for dividing said drive clock supplied from said clock enabler block to generate a divide clock and a load signal; and
a parallel-to-serial converter for converting said parallel data supplied from said corresponding lane into said serial data in synchronization with said divide clock and said load signal generated by said divider and said drive clock generated by said clock enabler block,
wherein said plurality of lane blocks are grouped into a plurality of lane groups, and
in said clock enabler block:
a plurality of clock enablers are arranged in a tree structure of two stages;
an output path of an output drive clock of a clock enabler in a preceding stage of said two stages to which said reference clock is supplied is branched to a number of branches equivalent to a number of groups of said plurality of lane groups; and
clock enablers of said plurality of clock enablers of a succeeding stage of said two stages are arranged to a plurality of branches extending from said preceding stage and output drive clocks of said clock enablers of said succeeding stage are supplied to lane blocks of corresponding lane group,
wherein, said clock enabler block, in synchronizing said lane blocks on a sub lane group:
controls an output of said drive clock in accordance with said enable signal of a clock enabler of said plurality of clock enablers corresponding to said sub lane group subject to synchronization arranged on a branch path to be branched into a number corresponding to said number of groups of sub lane groups; and
controls another clock enabler of said plurality of clock enablers into a clock output state.

* * * * *